US012689005B2

(12) United States Patent
Eom et al.

(10) Patent No.: US 12,689,005 B2
(45) Date of Patent: Jul. 21, 2026

(54) SUBSTRATE PROCESSING APPARATUS

(71) Applicant: WONIK IPS CO., LTD.,
Pyeongtaek-si (KR)

(72) Inventors: Yong Taek Eom, Cheonan-si (KR);
Kang Hee Kim, Osan-si (KR); **Hyun
Kim**, Gwangju-si (KR)

(73) Assignee: WONIK IPS CO., LTD.,
Pyeongtaek-si (KR)

( * ) Notice: Subject to any disclaimer, the term of this
patent is extended or adjusted under 35
U.S.C. 154(b) by 798 days.

(21) Appl. No.: 18/081,166

(22) Filed: Dec. 14, 2022

(65) Prior Publication Data

US 2024/0014011 A1      Jan. 11, 2024

(30) Foreign Application Priority Data

Jul. 11, 2022      (KR) ........................ 10-2022-0085102

(51) Int. Cl.
*H01J 37/32*            (2006.01)
(52) U.S. Cl.
CPC .. *H01J 37/32449* (2013.01); *H01J 37/32082*
(2013.01); *H01J 37/32522* (2013.01)
(58) Field of Classification Search
CPC .......... H01J 37/32449; H01J 37/32082; H01J
37/32522; H01J 37/32009; H01J
2237/334; H01J 37/3244; H01J 37/32174;
H01J 37/321; H01J 37/20; H01J
37/32091; H01J 37/32192; H01L
21/67069; H01L 21/3065; H01L
21/31116; C23C 16/507; C23C 16/455;
C23C 16/45591; C23C 16/4412; C23C
16/452

USPC .......... 118/723 I, 723 IR, 723 MW, 723 ME,
118/723 MR, 723 MA, 715; 156/345.48,
156/345.49, 345.36, 345.41, 345.31,
156/345.32
See application file for complete search history.

(56) References Cited

U.S. PATENT DOCUMENTS 9,552,966 B2 *    1/2017    Komatsu ........... H01J 37/32449
2014/0283746 A1 *    9/2014    Seo ........................ C23C 16/513
118/723 R (Continued)

FOREIGN PATENT DOCUMENTS

KR        1020210013335 A        2/2021
KR        1020220049925 A        4/2022

*Primary Examiner* — Rudy Zervigon
(74) *Attorney, Agent, or Firm* — WILLIAM PARK AND
ASSOCIATES LTD.

(57)            ABSTRACT

The present invention disclosed herein relates to a substrate
processing apparatus, and more particularly, to a substrate
processing apparatus capable of processing a substrate using
plasma. A substrate processing apparatus includes: a process
chamber having an opening in an upper portion thereof; a
gas injection part coupled to the opening to define a pro-
cessing space for substrate processing together with the
process chamber and inject a process gas into the processing
space; and a plurality of plasma generation parts disposed
above the gas injection part to generate plasma and config-
ured to radicalize the process gas so as to supply the
radicalized process gas into the gas injection part, wherein
one and the other of the plurality of plasma generation parts
are disposed at heights different from each other from a
bottom surface of the gas injection part.

19 Claims, 7 Drawing Sheets

(56)　　　　　　References Cited

U.S. PATENT DOCUMENTS

| | | | |
|---|---|---|---|
| 2014/0283747 A1* | 9/2014 | Kasai | C23C 16/452 |
| | | | 239/549 |
| 2015/0155178 A1* | 6/2015 | Kim | H01L 21/6719 |
| | | | 156/345.34 |
| 2016/0160351 A1* | 6/2016 | Seo | C23C 16/509 |
| | | | 118/723 R |

* cited by examiner

SUBSTRATE PROCESSING APPARATUS

CROSS-REFERENCE TO RELATED APPLICATIONS

This U.S. non-provisional patent application claims priority under 35 U.S.C. § 119(a) of Korean Patent Application No. 10-2022-0085102, filed on Jul. 11, 2022, in the Korean Intellectual Property Office, the entire contents of which are hereby incorporated by reference.

FIELD OF THE INVENTION

The present invention disclosed herein relates to a substrate processing apparatus, and more particularly, to a substrate processing apparatus capable of processing a substrate using plasma.

BACKGROUND ART

In a substrate processing process, an ashing process refers to a process of removing a photoresist film remaining after an etching process using photoresist.

In general, the ashing process is performed using a dissociated process gas, for example, radicals ionized through plasma, and thus, a substrate processing apparatus for the ashing process includes a plasma generator that supplies the dissociated process gas to a processing space inside a process chamber.

As the substrate becomes larger, a plane area and volume of the processing space inside the process chamber, and thus, it is difficult to uniformly supply the dissociated process gas to the entire substrate, resulting in deteriorating substrate processing uniformity.

SUMMARY OF THE INVENTION

To solve the above-mentioned limitations, the present invention provides a substrate processing apparatus capable of improving substrate processing uniformity.

In accordance with an embodiment of the present invention, disclosed is a substrate processing apparatus including: a process chamber (100) having an opening in an upper portion thereof; a gas injection part (200) coupled to the opening to define a processing space (S1) for substrate processing together with the process chamber (100) and inject a process gas into the processing space (S1); and a plurality of plasma generation parts (300) disposed above the gas injection part (200) to generate plasma and configured to radicalize the process gas so as to supply the radicalized process gas into the gas injection part (200), wherein one and the other of the plurality of plasma generation parts (300) are disposed at heights different from each other from a bottom surface of the gas injection part (200).

The substrate processing apparatus may further include a support (500) provided between at least one of the plurality of plasma generation parts (300) and a top surface of the gas injection part (200) to support the plasma generation part (300) so as to be spaced apart from the top surface of the gas injection part (200).

The support (500) may be provided with a supply passage (S2) communicating between the plasma generation part (300) and the gas injection part (200) therein.

The substrate processing apparatus may further include an insulating plate (600) provided between the plasma generation part (300) and the gas injection part (200).

The insulating plate (600) may be disposed to be in contact with the gas injection part (200), and the support (500) may be installed above the insulating plate (600).

The substrate processing apparatus may further include a cooling plate (700) provided between the plasma generation part (300) and the gas injection part (200) and provided with a circulation passage through which a heat medium is circulated.

The substrate processing apparatus may further include a docking adapter (1000) provided between the plasma generation part (300) and the support (500) to connect the plasma generation part (300) to the support (500).

The gas injection part (200) may have an installation groove (201), which is installed by embedding a portion of the plasma generation part (300) into at least a portion of the top surface on which the plurality of plasma generation parts (300) are disposed.

The plasma generation part (300) may include: at least one first plasma generation part (310) disposed at a central side of the gas injection part (200) on a plane to generate plasma and supply the process gas to the gas injection part (200); and at least one second plasma generation part (320) disposed at an edge side of the gas injection part (200) on the plane to generate plasma and supply the process gas to the gas injection part (200).

The first plasma generation part (310) may be disposed at a higher position from the bottom surface of the gas injection part (200) than the second plasma generation part (320).

The second plasma generation part (320) may be provided in plurality, and the plurality of second plasma generation parts may be disposed to be point-symmetrical to each other on the plane with respect to the first plasma generation part (310).

The plurality of second plasma generation parts (320) may be disposed at the same height as each other, which is a low position from the bottom surface of the gas injection part (200) rather than the first plasma generation part (300).

The gas injection part (200) may include a backing plate (210) which is installed in the opening and in which a plurality of gas introduction parts (211) are provided, at positions corresponding to the plurality of plasma generation parts (300).

RF power may be applied to the backing plate (210).

The gas injection part (200) may include a plurality of diffusion plates (230) provided at positions overlapping the plurality of gas introduction parts (211) on a plane below the backing plate (210).

The gas injection part (200) may include an injection plate (220) which is installed below the backing plate (210) to define a diffusion space (S3), in which the diffusion plate (230) is installed between the backing plate (210) and the injection plate (220), and in which a plurality of injection holes (221) for injecting the process gas are defined.

The gas injection part (200) may include an injection plate (220) installed below the backing plate (210) to define a plurality of injection holes (221) through which the process gas is injected into the processing space (S1).

The gas injection part (200) may include a support shaft (240) having one end coupled to pass through the backing plate (210) so as to be accessible from a top surface of the backing plate (210) and the other end coupled to the diffusion plate (230) to support the diffusion plate (230).

The substrate processing apparatus may further include a power apply part (400) disposed on a top surface of the gas injection part (200) to apply RF power to the plasma generation part (300).

The power apply part (400) may independently apply the RF power to each of the plurality of plasma generation part (300).

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2A and 2B are cross-sectional view illustrating a configuration of the substrate processing apparatus of FIG. 1, wherein FIG. 2A is a cross-sectional view in a direction A-A', and FIG. 2B is a cross-sectional view in a direction B-B';

FIGS. 3A and 3B are enlarged cross-sectional views illustrating configurations of a gas injection part and a plasma generation part of the substrate processing apparatus of FIG. 1, wherein FIG. 3A is an enlarged cross-sectional view illustrating a shape of a side of a second plasma generation part, and FIG. 3B is an enlarged view illustrating a shape of a side of the first plasma generation part:

DETAILED DESCRIPTION OF THE PREFERRED EMBODIMENTS

Figure 1:
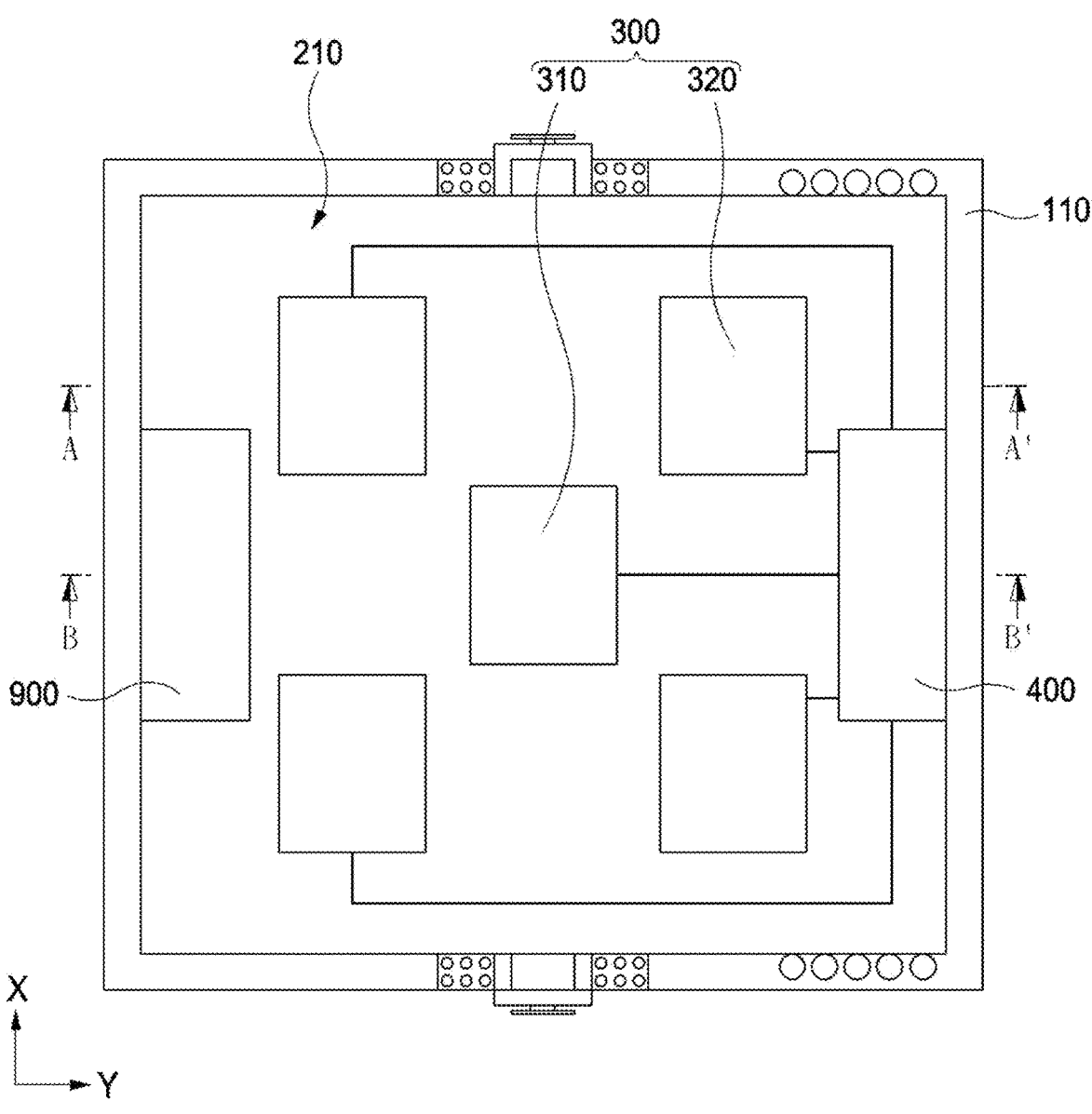
FIG. 1 is a plan view illustrating a substrate processing apparatus according to the present invention.

Hereinafter, a substrate processing apparatus according to the present invention will be described with reference the accompanying drawings.

The present invention relates to a substrate processing apparatus for processing a substrate using plasma, and more specifically, to a substrate processing apparatus for performing processing (e.g., etching process) on a substrate using a dissociated process gas, e.g., radicals ionized through plasma to improve substrate processing uniformity in response to a large area of the substrate.

Here, the substrate processing apparatus according to the present invention may include a plasma generation part that performs predetermined processing on the substrate using the radicals ionized through the plasma.

Here, a plurality of plasma generation parts may be installed to be appropriately symmetrical to each other in consideration of a uniform process for the substrate. When the plurality of plasma generation parts are disposed in rows at equal intervals, a substrate processing rate for a center of the substrate may be reduced, and w % ben the plasma generation parts are installed at the center and edge of the substrate, respectively, a substrate processing rate for the edge of the substrate may be relatively reduced.

Therefore, there is a need to control a degree of dissociation of the process gas according to the installed plasma generation part and the processing rate for each portion of the substrate through the degree of the dissociation.

In this case, it is difficult control the substrate processing rate through individual RF power and a control of a gas supply amount for each plasma generation part so as to be reduced to an appropriate level or less in consideration of an aspect of process efficiency that has to be maintained to a certain level or more, and thus, there is a limitation in that its limit is clear.

In addition, when the plasma generation part is installed in plurality within a limited area, there is a limitation in that accessibility and convenience of maintenance for structures including the plasma generation parts, furthermore, the gas injection part according to the installation position are deteriorated.

More specifically, when the plasma generation part disposed at the center is disposed to be in contact with the gas injection part, it is difficult to access the center-side plasma generation part in a state in which all the peripheral plasma generation parts are disposed at the same height, resulting in a difficult in maintenance.

Furthermore, the plasma generation part and a diffusion plate have to be disposed at positions aligned on a plane, and thus, when the plasma generation part is installed in contact with a backing plate, it is difficult to expose and access a bolt for installing the diffusion plate at an upper side of the backing plate, and thus, maintenance of the diffusion plate has to be performed by separating the backing plate from the process chamber. Therefore, it is difficult and inconvenient to perform maintenance on a gas injection part.

Figure 2A:
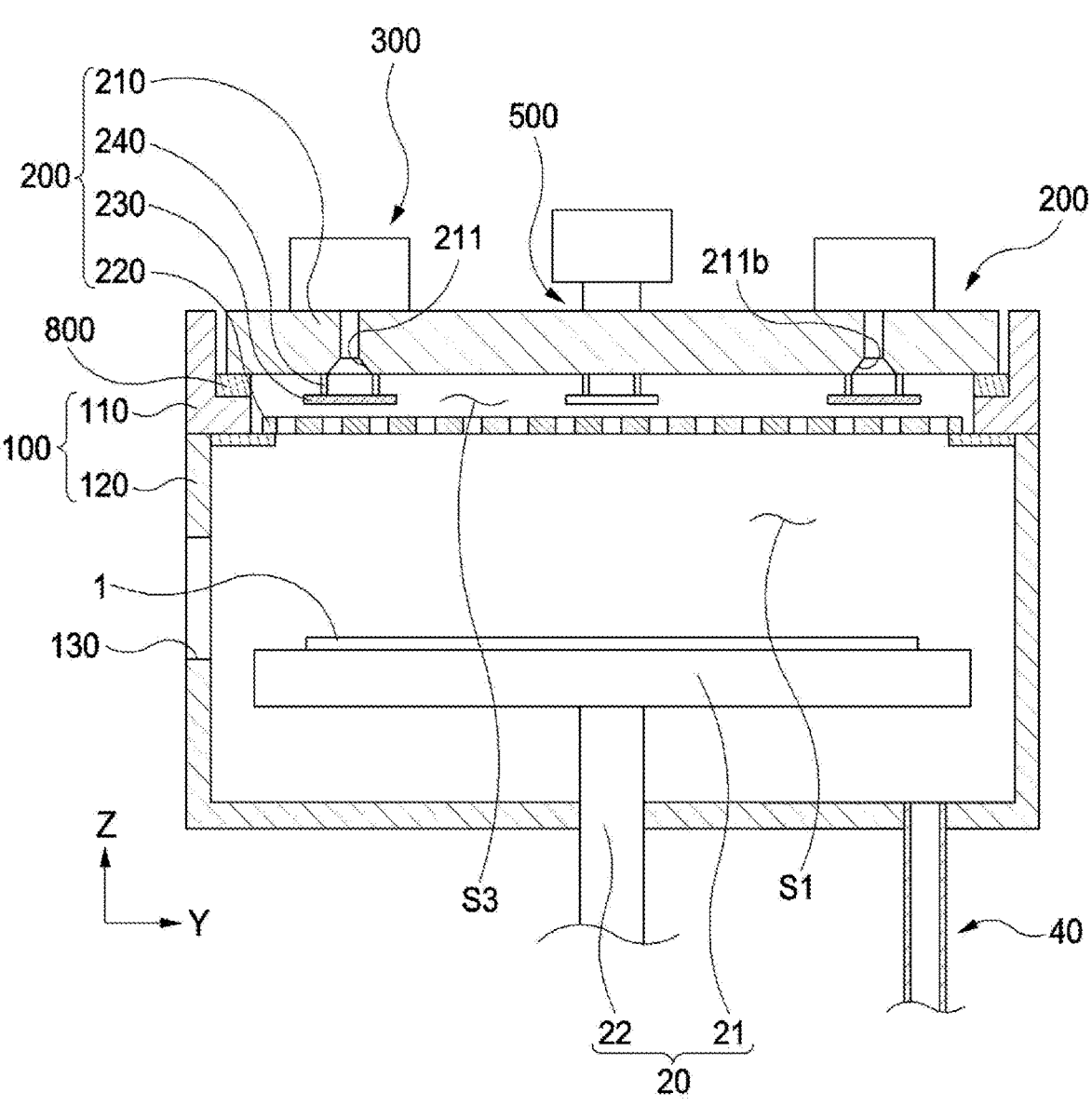
Figure 2B:
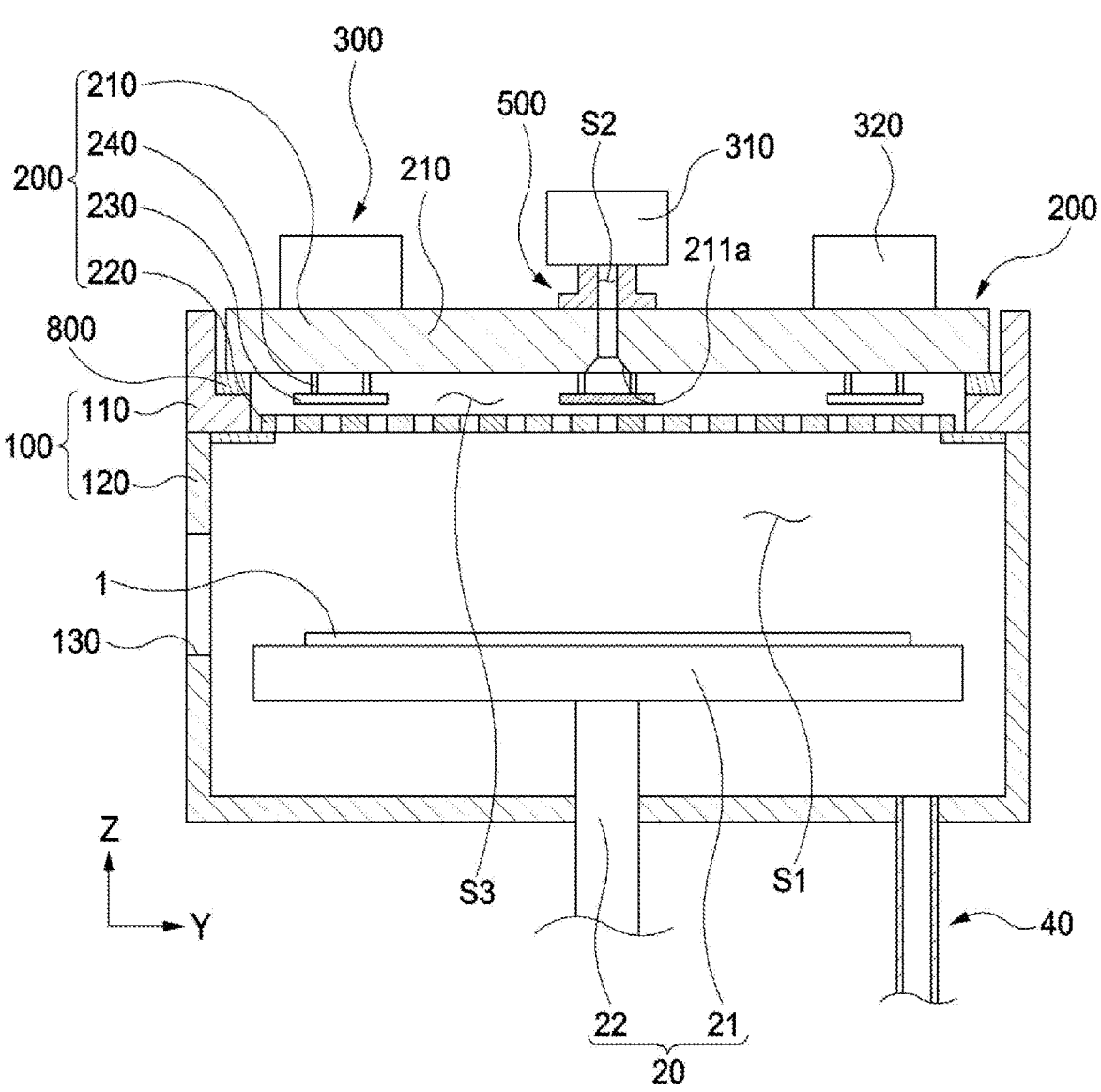

In order to solve the above-described limitations, as illustrated in FIGS. 2A and 2B, a substrate processing apparatus according to the present invention includes a process chamber 100 having an opening defined in an upper portion thereof, a gas injection part 200 coupled to the opening to define a processing space S1 for processing a substrate together with the process chamber 100 and injecting a process gas into the processing space S1, and a plurality of plasma generation parts 300 disposed above the gas injection part 200 to generate plasma and supplying the process gas to the gas injection part 200.

In addition, the substrate processing apparatus according to the present invention may further include an exhaust part 40 disposed on a bottom surface of the process chamber 100 to exhaust the processing space S1.

In addition, the substrate processing apparatus according to the present invention may further include a power apply part 400 disposed on a top surface of the gas injection part 200 to apply RF power to the plasma generation part 300.

In addition, the substrate processing apparatus according to the present invention may include a support 500 provided between at least one of the plurality of plasma generation parts 300 and the gas injection part 200 to support the plasma generation part 300 so that the plasma generation part 300 is spaced apart from a top surface of the gas injection part 200.

In addition, the substrate processing apparatus according to the present invention may further include an insulating plate 600 provided between the plasma generation part 300 and the gas injection part 200.

In addition, the substrate processing apparatus according to the present invention may further include a cooling plate 700 provided between the plasma generation part 300 and the gas injection part 200 and having a circulation passage through which a heat medium is circulated.

In addition, the substrate processing apparatus according to the present invention may further include an insulating member 800 disposed between the process chamber 100 and the gas injection part 200.

Here, a substrate 1, which is a subject of substrate processing, may be a configuration, on which substrate processing such as etching and deposition is performed, and any substrate such as a semiconductor manufacturing substrate, an LCD manufacturing substrate, an OLED manufacturing substrate, a solar cell manufacturing substrate, and a transparent glass substrate may be applied as the substrate 1.

The process chamber 100 may include a chamber body 120 having an opened upper side and an upper lid 110 detachably coupled to the opening of the chamber body 120.

The chamber body 120 may be a configuration in which a substrate support 20 is installed and may have various configurations. One or more gates 130 may be provided on an inner wall for introducing and discharging the substrate 1 into the processing space S1.

The upper lid 110 may cover the opening of the chamber body 120 to provide the sealed processing space S1 together with the chamber body 120, and any configuration may be applied.

For example, the upper lid 110 may have various configurations such as a frame shape having an opening in a central portion through which the insulating member 800 is interposed so that the gas injection part 200 to be described later is installed to pass therethrough.

The substrate support 20 may be installed below the processing space S1 in the process chamber 100 to support the substrate 1 and may have various configurations.

For example, the substrate support 20 may include a substrate seating part 21 on which the substrate 1 is seated, and a support shaft 22 installed below the substrate seating part 21 so that the substrate seating part 21 moves vertically.

The substrate support 20 may be installed to move vertically to load and unload the substrate 1 through the gate 130. Furthermore, a temperature control member for controlling a temperature such as heating or cooling the substrate 1 may be additionally installed.

The exhaust part 40 may be configured to exhaust the processing space S1 defined on the bottom surface of the processing chamber 100 and may have various configurations.

The exhaust part 40 may be provided at one side of the bottom surface of the process chamber 100 and connected to an external pump and may perform the exhaust of the processing space S1.

Particularly, since the process may be performed in a vacuum state in the processing space S1, a vacuum atmosphere may be formed in the processing space S1.

The gas injection part 200 may be a configuration that is coupled to the opening to define the processing space S1 for the substrate processing together with the process chamber 100 and injects the process gas into the processing space S1.

Here, in order to lower an installation height of a portion of the plurality of plasma generation parts 300 in the gas injection part 200, an installation groove 201 in which a portion of the plasma generation part 300 is embedded and installed may be defined in the top surface.

Here, the installation groove 201 may be defined in a top surface of the backing plate 210 to be described later, and a depth of the installation groove 201 may be determined according to a required height of the plasma generation part 300 to be installed.

The installation groove 201 may be additionally provided with an insulating part for electrical insulation between the plasma generation parts 300.

In addition, in order to increase in installation height of a portion of the plurality of plasma generation parts 300, a protrusion support (not shown) protruding to support the plasma generation part 300 may be disposed on a top surface of the gas injection part 200.

That is, the injection part 200 may protrude from the top surface of the backing plate 210, and the plasma generation part 300 may be seated and supported, and thus, the plasma generation part 300 may increase in installation height.

The gas injection part 200 may include a backing plate 210 installed at the opening and provided with a plurality of gas introduction parts 211 disposed at positions corresponding to the plurality of plasma generation parts 300.

In addition, the gas injection part 200 may include a plurality of diffusion plates 230 provided at positions overlapping the plurality of gas introduction parts 211 on a plane below the backing plate 210, respectively.

In addition, the gas injection part 200 may include an injection plate 220 which is installed below the backing plate 210 to define a diffusion space S3, in which the diffusion plate 230 is installed between the backing plate 210 and the injection plate 220, and in which a plurality of injection holes 221 for injecting the process gas are defined.

In addition, the gas injection part 200 may include a support shaft 240 having one end coupled to pass through the backing plate 210 so as to be accessible from the top surface of the backing plate 210 and the other end coupled to the diffusion plate 230 to support the diffusion plate 230.

The backing plate 210 may be a configuration in which the gas introduction parts 211 installed on an upper end of the process chamber 100 to supply the process gas, more particularly, at least one first gas introduction part 211a and at least one second gas introduction part 211b are provided.

Here, in the backing plate 210, the first gas introduction part 211a may be connected to the first plasma generation part 310 to be described later to receive a radicalized process gas, and the second gas introduction part 211b may be connected to the second plasma generation part 320 to be described later to receive a radicalized process gas.

Thus, the backing plate 210 may receive the process gas from the outside to transfer the process gas to the processing space S1 via the diffusion plate 230 installed below.

In addition, RF power may be applied to the backing plate 210. Here, the applied RF power may be transmitted to the diffusion plate 230 coupled thereto.

Here, the insulating member 800 for the electrical insulation may be disposed between an edge of the backing plate 210 and the process chamber 100, more particularly, the top lid 110 to maintain independent electrical states.

As another example, as the RF power is applied to the backing plate 210 and coupled to the diffusion plate 230 through a separate insulating member, the transmission of the RF power to the diffusion plate 230 may be blocked, and the RF power may not be applied to the backing plate 210.

The first gas introduction part 211a may be configured to introduce the process gas into the backing plate 210, and more specifically, may be provided to pass through a center of the backing plate 210.

Here, the first gas introduction part 211a may be provided to pass in the vertical direction and may have an upper side connected to the above-described first plasma generation part 310 and a lower side that gradually increases in inner diameter downward.

That is, the first gas introduction part 211a may allow a portion of the process gas passing therethrough to be naturally diffused in the horizontal direction and may induce the diffusion of the process gas through a diffusion member and a diffusion plate 230 to be described later.

The second gas introduction part 211b may be configured to introduce the process gas into the backing plate 210, like the first gas introduction part 211a, and may be defined at an edge to pass.

For example, a plurality of second gas introduction parts 211b may be disposed at an edge around the first gas introduction part 211a.

Here, the second gas introduction part 211b may be provided to pass in the vertical direction and may have an upper side connected to the above-described second plasma generation part 320 and a lower side that gradually increases in inner diameter downward.

That is, like the first gas introduction part 211a, the second gas introduction part 211b may allow a portion of the process gas passing therethrough to be naturally diffused in the horizontal direction and may induce the diffusion of the process gas through a diffusion member and a diffusion plate 230 to be described later.

As the plate member, the backing plate 210 may be provided in a rectangular shape on a plane corresponding to the shape of the substrate 1, and as another example, may be provided in a circular or elliptical shape on the plane.

In addition, the backing plate 210 may have an installation groove 101 extending from each of the first gas introduction part 211a and the second gas introduction part 211b, and a support shaft 240 to be described below may be installed to support to support the diffusion plate 230 to be described later.

In addition, the backing plate 210 may further include a diffusion member (not shown) disposed in each of the first gas introduction part 211a and the second gas introduction part 211b to provide an inclined surface so that the process gas supplied through the first gas introduction part 211a and the second gas introduction part 211b is diffused.

For example, the diffusion member may have a conical structure in which the inclined surface is disposed on a side surface thereof and may be installed in each of the first gas introduction part 211a and the second gas introduction part 211b so that the process gas introduced from an upper side is induced to be partially diffused in a lateral direction along the inclined surface.

Here, the diffusion member may be provided in a conical shape and installed to be supported on the bottom surface of the backing plate 210. Alternatively, the diffusion member may be provided to protrude from a top surface of the diffusion plate 230 to be described later.

In addition, the diffusion member may be provided in a shape corresponding to an inner surface of each of the first gas introduction part 211a and the second gas introduction part 211b, which are expanded downward. Thus, the diffusion member may induce the diffusion of the process gas in the horizontal direction together with the inner surfaces of the first gas introduction part 211a and the second gas introduction part 211b.

The diffusion plate 230 may be provided below the backing plate 210 to diffuse the process gas supplied through the first gas introduction part 211a and the second gas introduction part 211b, thereby transferring the process gas to the processing space S1.

That is, the diffusion plate 230 may be supported and installed on the bottom surface of the backing plate 210 so as to be spaced apart from the backing plate 210.

For example, a plurality of diffusion plates 230 may be individually installed at positions corresponding to the gas introduction parts 211 below the backing plate 210.

The diffusion plate 230 may be provided in a circular or elliptical shape at a position corresponding to each of the first gas introduction part 211a and the second gas introduction part 211b to induce the diffusion of the supplied process gas in all horizontal directions.

Here, the diffusion plate 230 may be provided in the circular or elliptical shape as described above, and as another example, the diffusion plate 230 may be provided as a rectangular plate or a polygonal plate.

In addition, the diffusion plate 230 may be made of a metal material that is easy to process and has excellent durability, including formation of the diffusion hole described later. Here, surface processing may be performed on the bottom surface exposed to the processing space S1.

More particularly, the diffusion plate 230 may be a metal material, and the surface processing for reinforcing at least a portion of the bottom surface exposed to the processing space may be performed on the diffusion plate 230. More particularly, anodizing or Y203 coating may be performed to reinforce rigidity and corrosion resistance in consideration that the bottom surface of the metal material including aluminum is exposed to the processing space S1.

In addition, the diffusion plate 230 may include a plurality of diffusion holes through which the process gas passes so as to diffuse the introduced process gas in the horizontal direction and transfer the process gas to the lower side.

Here, the diffusion holes may be provided in plurality by vertically passing through the top and bottom surfaces, and more preferably, may be provided in rows and columns at regular intervals on a plane.

The diffusion hole may be defined to be parallel to the first gas introduction part 211a and the second gas introduction part 211b in the vertical direction, and thus, the introduced process gas may be induced to be transferred in the vertical direction without changing the traveling direction.

The injection plate may be installed below the backing plate 210 and have a plurality of injection holes 221 for injecting the process gas into the processing space S1 and may have various configurations or be omitted as described above.

For example, in the injection plate 220, the plurality of injection holes 221 installed at intervals below the backing plate 210 to inject the gas into the processing space S1 may be defined.

Here, the plurality of injection holes 221 may be configured to inject the gas into the processing space S1 and may have various shapes, numbers, and arrangements.

That is, the injection plate 220 may define a diffusion space S3 for installing the diffusion plate 230 between the backing plates 210 to induces the diffusion plate 230 to be installed in the diffusion space S3.

Also, as another example, the injection plate 220 may be omitted, or the injection plate 220 may be installed, and the diffusion plate 230 may be omitted.

The support shaft 240 may be configured to have one end coupled to pass through the backing plate 210 so as to be accessible from the top surface of the backing plate 210 and the other end coupled to the diffusion plate 230 to support the diffusion plate 230.

That is, the support shaft 240 may be configured to fix and support the diffusion plate 230 to the backing plate 210 so as to overlap the gas injection part 211 disposed on the backing plate 210 in the plan view.

For this, the support shaft 240 may be installed vertically and have the other end coupled to an edge side of the diffusion plate 230 and one end coupled to a position of the installation groove 201 of the backing plate 210 to stably support the diffusion plate 230.

The support shaft 240 may have one end coupled by passing through the backing plate to be accessible from an upper side of the backing plate 210 in the maintenance process for the backing plate 210 and the diffusion plate 230.

Thus, as the plasma generation part 300 is spaced upward from the backing plate 210, the maintenance may be performed more easily.

The support shaft may include a plurality of plasma generation parts 300 disposed above the gas injection part 200 to generate plasma, thereby supplying the process gas to the gas injection part 200.

The plasma generation part 300 may be configured to be connected to the gas introduction part 211 at an upper side of the process chamber 100 so as to supply the process gas radicalized through the plasma to the gas introduction part 211.

Here, the conventionally disclosed inductively coupled plasma source may be applied to the plasma generation part 300, and as another example, a ferromagnetic ICP (FMICP) plasma source in which a magnetic material such as ferrite capable of generating high-density plasma even at relatively low power and having excellent lifespan and durability is used as a core may be applied to the plasma generation part 300.

For example, the plasma generation part 300 may include a plasma generation chamber disposed at a position corresponding to the gas introduction part 211 at the upper side of the process chamber 100, more specifically, at the upper portion of the backing plate 210 and a plasma source provided in the plasma generation chamber.

Here, the plasma generation part 300 may receive the process gas from the outside to ionize the radicalize the process gas by allowing the plasma source to pass therethrough, thereby transferring the process gas to the gas introduction part 211.

For this, the plasma generation part 300 may be disposed on the plane of the backing plate 210 corresponding to a positions of each of the plurality of gas introduction parts 211.

The plasma generation part 300 may be provided in plurality to correspond to the plurality of gas introduction parts 211 and may be disposed to a one-to-one correspond to the gas introduction parts 211 or provided in plurality to respectively correspond to a certain number of gas introduction parts 211.

Here, one of the plurality of plasma generation parts 300 may be disposed at a height different from that of the other one from the bottom surface of the gas injection part 200.

That is, since one of the plurality of plasma generation parts 300 is disposed at a height different from that of the other one, a vertical distance from the substrate 1 to be processed may vary.

For example, the plasma generation part 300 may include at least one first plasma generation part 310 disposed at a central side of the gas injection part 200 on the plane to generate plasma and supply the process gas to the gas injection part 200 and at least one second plasma generation part 320 disposed at an edge side of the gas injection part 200 on the plane to generate plasma and supply the process gas to the gas injection part 200.

The first plasma generation part 310 may be a configuration that is disposed at the central side of the gas injection part 200 to generate the plasma and may have various configurations.

Here, at least one of the first plasma generation parts 310 may be disposed to overlap the gas injection part 200, more particularly, the first gas introduction part 211*a* disposed at the central side of the backing plate 210 on the plan view to supply the radicalized process gas to the first gas introduction part 211*a*.

That is, the first plasma generation part 310 may receive the process gas from the outside to ionize the radicalize the process gas by allowing the plasma source to pass therethrough, thereby transferring the process gas to the first gas introduction part 211*a*.

The first plasma generation part 320 may be a configuration that is disposed at the edge side of the gas injection part 200 to generate the plasma and may have various configurations.

Here, at least one of the second plasma generation parts 320 may be disposed to overlap the gas injection part 200, more particularly, the second gas introduction part 211*b* disposed at the edge side of the backing plate 210 on the plan view to supply the radicalized process gas to the second gas introduction part 211*b*.

That is, the second plasma generation part 320 may receive the process gas from the outside to ionize the radicalize the process gas by allowing the plasma source to pass therethrough, thereby transferring the process gas to the second gas introduction part 211*b*.

Here, the first plasma generation part 310 may be provided in a single number at the center of the backing plate 210 on the plane, and the second plasma generation part 320 may be provided in plurality at the edge side of the backing plate 210 on the plane.

For example, the second plasma generation part 320 may be provided in four corresponding to the corner, that is, the edge side of the square backing plate 210. As another example, four second plasma generation parts 320 may be provided to correspond to the corner sides.

That is, the second plasma generation part 320 is provided in plurality and may be disposed to be point-symmetrical to each other on the plane with respect to the first plasma generation part 310.

The first plasma generation part 310 and the second plasma generation part 320 may be disposed at different heights, and more specifically, may be spaced distances from each other from the bottom surface of the gas injection part 200.

Here, when the plurality of plasma generation parts 300 are disposed at both the center and the edge, a processing rate for the central side of the substrate 1 in the processing space S1 may be higher than a processing rate for the edge side, and thus, the height of the first plasma generation part 310 may be higher than that of the second plasma generation part 320.

That is, the first plasma generation part 310 may be disposed at a higher position from the bottom surface of the gas injection part 200 than the second plasma generation part 320.

The height of the first plasma generation part 310 may be lower than the height of the second plasma generation part 320 according to types and process environments of the process to be processed.

Here, the height of the first plasma generation part 310 may be installed higher than the height of the second plasma generation part 320, and the plurality of second plasma generation parts 320 may be disposed at the same height, which is a low position from the bottom surface of the gas injection part 200 rather than the first plasma generation part 300.

That is, the first plasma generation part 310 may have a vertical distance from the bottom surface of the gas injection part 200, which is greater than that of the second plasma generation part 320.

The support 500 may be a configuration that is provided between at least one of the plurality of plasma generation parts 300 and the gas injection part 200 to support the plasma generation part 300 so that the plasma generation part 300 is spaced apart from a top surface of the gas injection part 200.

That is, the support 500 may support the plasma generation part 300 at a distance from the top surface of the gas injecting part 200 so that any one of the plurality of plasma generation parts 300 is disposed at a height different from that of the other one.

Here, the support 500 may have a supply passage S2 communicating between the plasma generation part 300 and the gas injection part 200, more specifically, the gas introduction part 211 to transfer the process gas from the plasma generation part 300 toward the gas introduction part 211.

For this, the support 500 may have a cylindrical shape in which a hollow is defined and may be disposed at an appropriate height as necessary and may be replaced and installed with any one of the supports 500 having various heights according to the user's determination.

In addition, the support 500 may be coupled to a docking adapter 1000 provided separately for coupling with the plasma generation part 300, and more specifically, may be bolt-coupled to a lower side of the circular plate-shaped docking adapter 1000. The docking adapter 1000 may be coupled to the bottom surface of the plasma generation part 300 through the bolt connection so that the support 500 is connected and fixed to the plasma generation part 300.

For another example, the support 500 may have a configuration of which a length is adjustable. Thus, if necessary to adjust the height of the plasma generation part 300, a length of the plasma generation part 300 may be adjustable.

For example, the support 500 may be appropriately adjusted in height using the bolt to be coupled when being bolt-coupled to the docking adapter 1000. Here, a bellows may be additionally provided in consideration of the supply passage S2 through which the process gas is transferred.

Figure 3A:
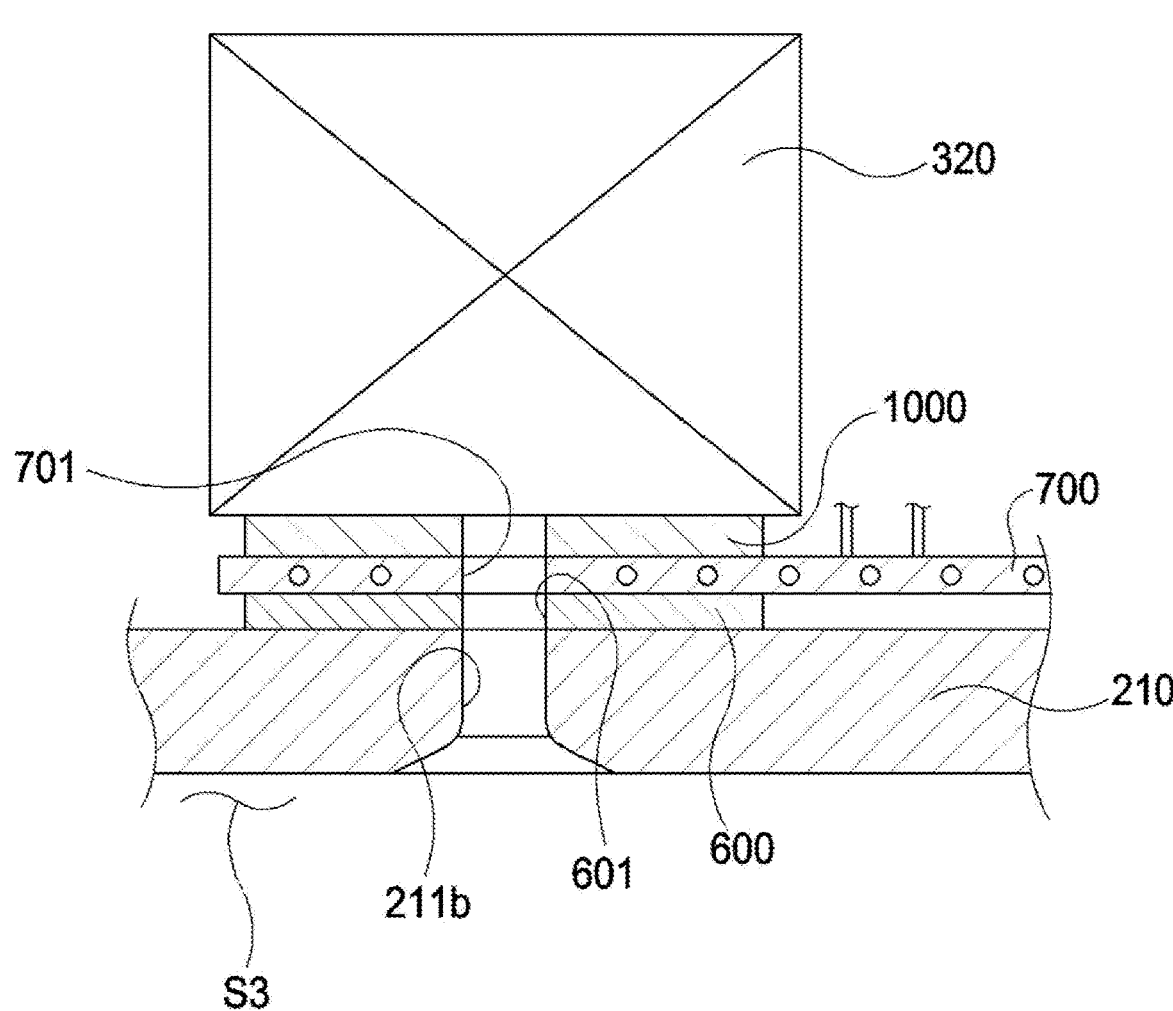
Figure 3B:
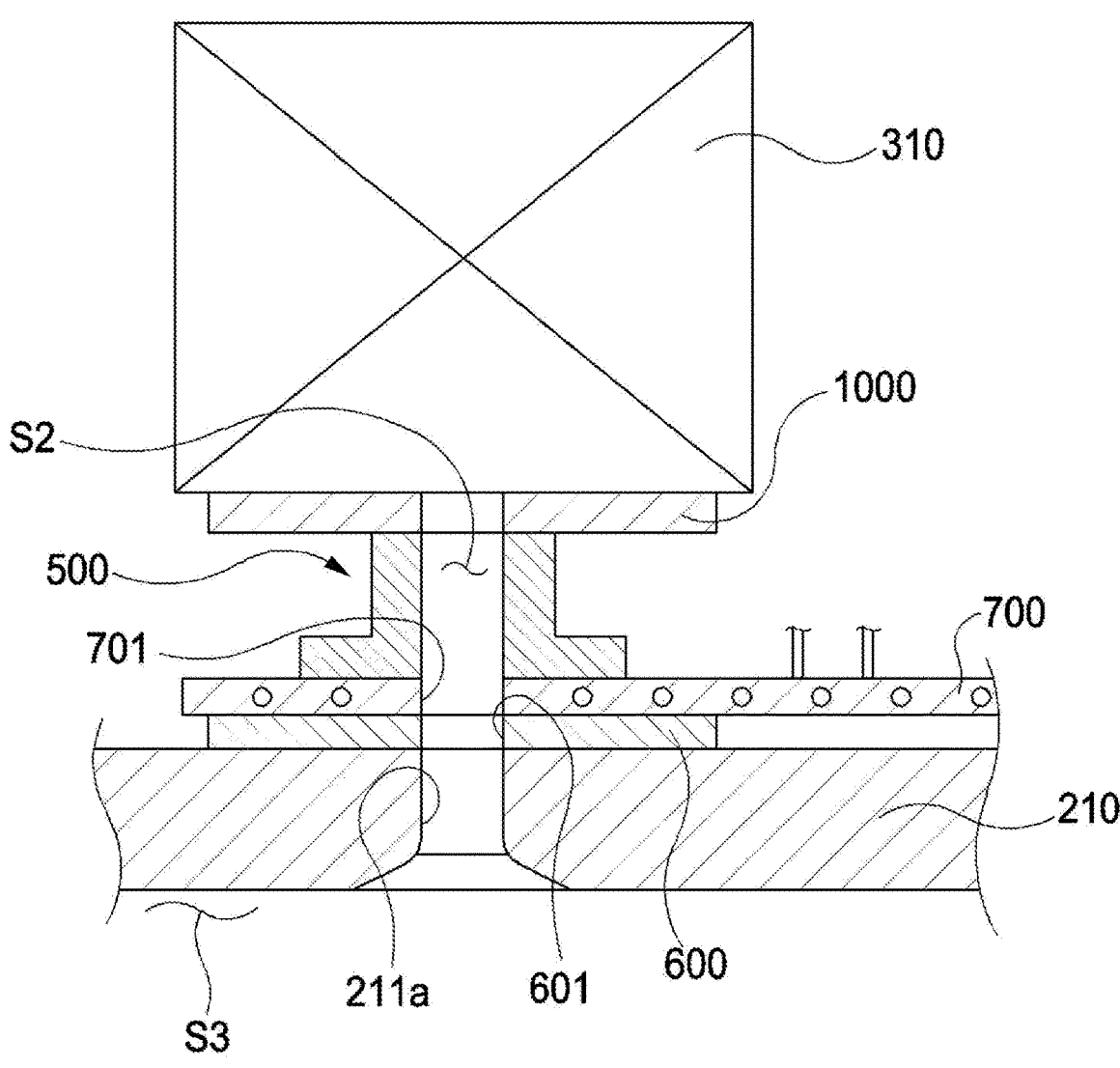

In addition, as illustrated in FIG. 3B, the support 500 may be installed between the first plasma generation part 310 and the first gas introduction part 211a so that the height of the first plasma generation part 310 is maintained higher than that of the second plasma generation part 320.

The insulating plate 600 may be provided between the plasma generation part 300 and the gas injection part 200 to perform electrical insulation between the gas injection part 200 and the plasma generation part 300.

That is, the insulating plate 600 may be made of an insulating material capable of the electrical insulation, and when RF power is applied to the plasma generation part 300 through a power apply part 400 described later, the shielding and electrical insulation may be performed between the insulating plate 600 and the gas injection part 200.

In addition, the insulating plate 600 may block electrical and magnetic interference between the backing plate 210 and the plasma generation part 300 when RF power is applied to the backing plate 210.

For this, the insulating plate 600 may be disposed to be in contact with the gas injection part 200, and the support 500 may be installed on the top surface.

More specifically, the insulating plate 600 may be installed to be in contact with the top surface of the gas injection part 200, and a cooling plate 700 to be described later may be provided at the upper side, and also, the support 500 may be installed above the cooling plate 700.

Here, since the hollow 601 of the insulating plate is defined in the center of the insulating plate 600, the supply passage S2 by the support 500 may communicate with the gas introduction part 211.

The cooling plate 700 may be provided between the plasma generation part 300 and the gas injection part 200 and may be configured to provide a circulation passage in which a heat medium is circulated and may have various configurations.

Here, in order to prevent leakage that occurs in the process of supplying the process gas between the gas injection part 200 and the plasma generation part 300, the cooling plate 700 may be installed to cool with respect to a sealing member (not shown) disposed on at least one of between the docking adapter 1000 and the plasma generation part 300, between the docking adapter 1000 and the support 500, between the support 500 and the cooling plate 700, between the cooling plate 700 and the insulating plate 600, between the insulating plate 600 and the backing plate 210.

That is, the sealing member, which is damaged and deteriorated below high-temperature environments to cause a particle limitation, may be cooled to reinforce durability of the sealing member and increase in maintenance and replacement cycle.

For this, the cooling plate 700 may have a circulation passage defined therein, and thus, a low-temperature heat medium may be supplied to the circulation passage to perform heat exchange, and then, after the heat exchange may be performed again through the circulation passage, the heat medium may be supplied to be repeatedly circulated.

Like the aforementioned insulating plate 600, in the cooling plate 700, the supply passage S2 may be provided at a position corresponding to the cooling plate hollow 701 passing through a center to communicate with the gas introduction part 211.

Figure 4:
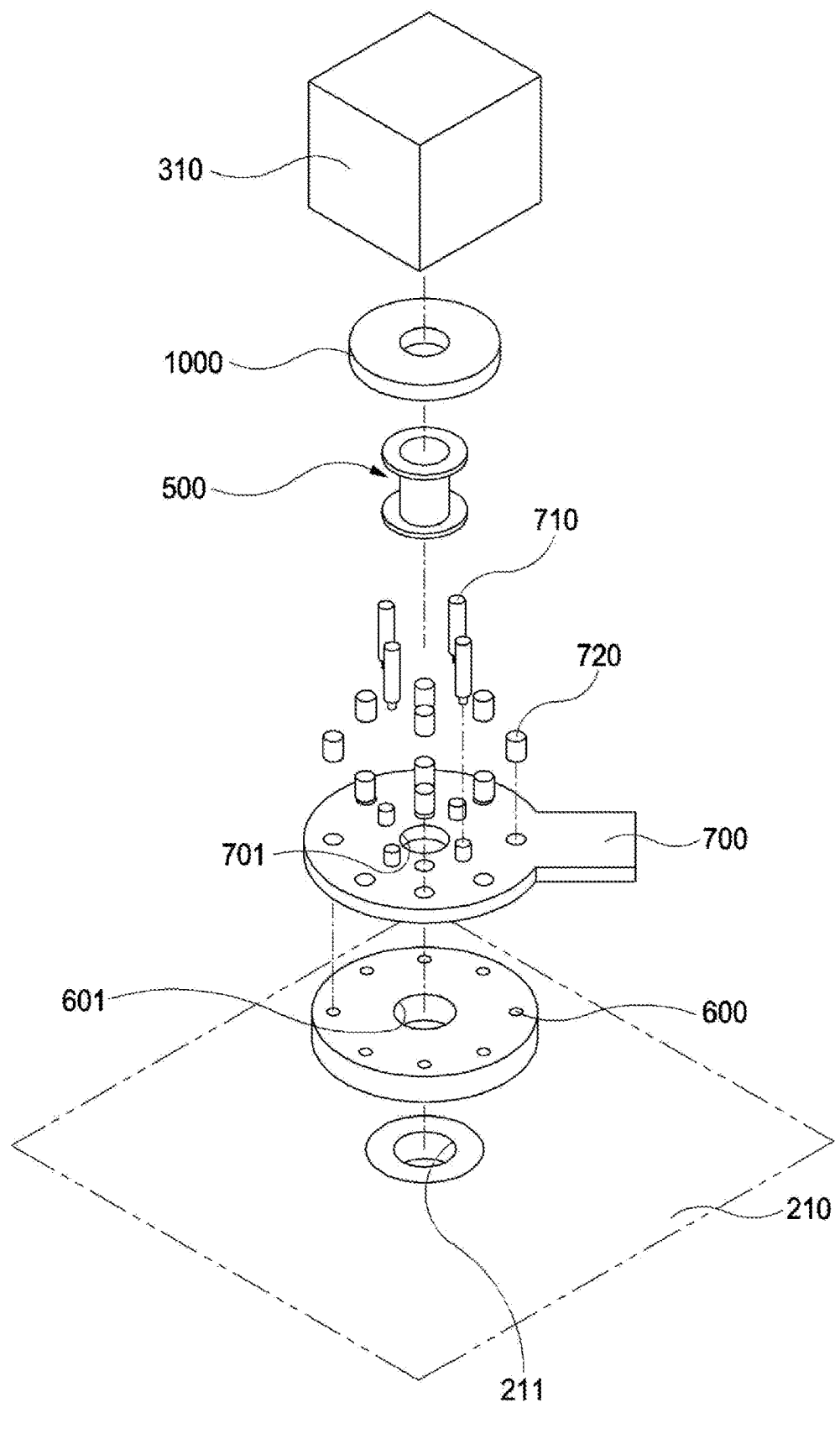
FIG. 4 is an exploded perspective view illustrating constitutions of the plasma generation part and the gas injection part in the substrate processing apparatus of FIG. 1.
Figure 5:
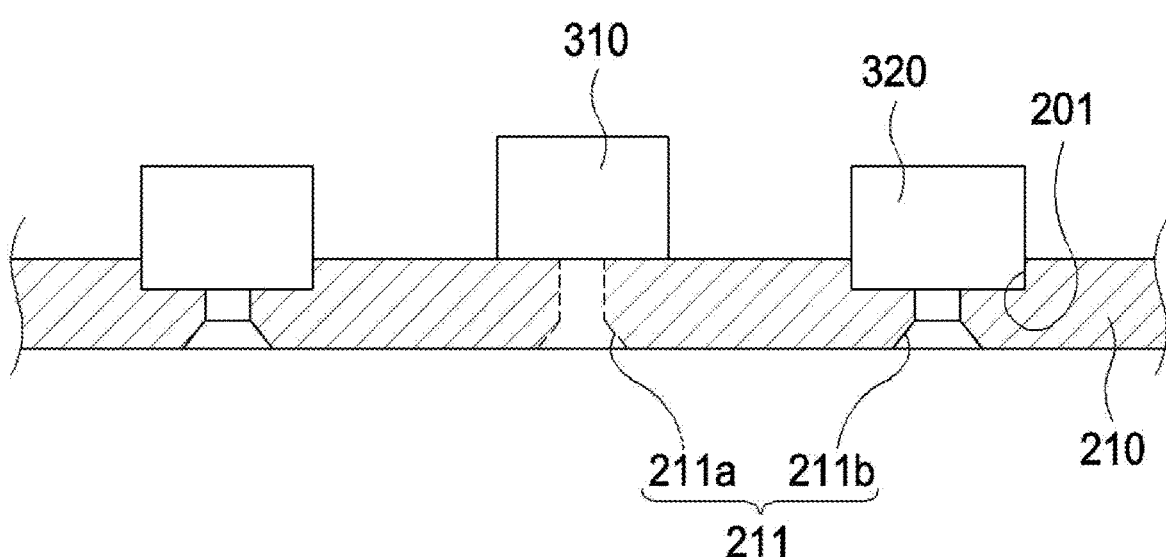
FIG. 5 is an enlarged cross-sectional view illustrating a gas injection part of a substrate processing apparatus according to another embodiment of the present invention.

As illustrated in FIG. 4, the cooling plate 700 and the insulating plate 600 may be coupled to vertically pass through each other through a plurality of first coupling members 720, respectively. In this state, the plurality of second coupling members 710 may be coupled to a top surface of the cooling plate 700 to pass through the bottom surface of the docking adapter 1000 or the plasma generation part 300 so as to be installed to be coupled or inserted.

Here, the insulating plate 600 or the cooling plate 700 may be omitted, or their positions may be variously changed such as being disposed between the support 500 and the plasma generation part 300.

As illustrated in FIG. 1, the power apply part 400 may be disposed on the top surface of the gas injection part 200 to apply RF power to the plasma generation part 300.

Here, the power apply part 400 may independently apply the RF power to each of the plurality of plasma generation parts 300 to independently control the plasma generation part 300.

In addition, the power apply part 400 may provide the RF power supplied through the power apply part 400 through a matching part 900 disposed adjacent to the top surface of the gas injection part 200, the plasma generation part 300, and the power apply part 400 through impedance matching.

The matching part 900 may be installed to connect the power apply part 400 to the plasma generation part 300 to effectively transmit power through the impedance matching when supplying high-frequency RF power for generating plasma to the plasma generation part 300.

The matching part 900 may include an air variable capacity (AVC) and a vacuum variable capacity (VVC), which are driven by a motor.

Therefore, the matching part 900 may adjust an output impedance of the power apply part 400 and a load impedance of the plasma generation part 300 to match each other to prevent a power loss and damage of the power apply part 400, which may occur by a phenomenon, in which an output of the power apply part 400 is not completely supplied to the plasma generation part 300, and a portion of the output is reflected to return again, from occurring.

In the substrate processing apparatus according to the present invention, the plurality of plasma generation parts may be disposed above the gas injection part to provide the uniformly dissociated process gas to the entire substrate even though the area of the substrate increases, thereby improving the substrate processing uniformity.

In addition, in the substrate processing apparatus according to the present invention, one and the other of the plurality of plasma generation parts may be disposed at the heights different from each other from the bottom surface of the gas injection part to more effectively provide the uniformly dissociated process gas to the entire substrate even though the area of the substrate increases, thereby improving the substrate processing uniformity.

In addition, in the substrate processing apparatus according to the present invention, the installation heights of the plurality of plasma generation parts with respect to the bottom surface of the gas injection part may be controlled to be different from each other to overcome the limitation in the range in RF power and supply amount of process gas for each of the plurality of plasma generation parts, thereby precisely controlling the processing rate for each area of the substrate without deteriorating the overall radical generation efficiency and process efficiency.

In addition, in the substrate processing apparatus according to the present to invention, some (e.g., the plasma generation parts disposed at the center of the gas injection part) the of the plasma generation parts may be disposed to be spaced apart from each other above the gas injection part to improve the accessibility of the workers and the convenience of maintenance for each of the structures.

Although the above description merely corresponds to some exemplary is embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. A substrate processing apparatus comprising:
a process chamber having an opening in an upper portion thereof;
a gas injection part coupled to the opening to define a processing space for substrate processing together with the process chamber and inject a process gas into the processing space;
a plurality of plasma generation parts disposed above the gas injection part to generate plasma and configured to radicalize the process gas so as to supply the radicalized process gas into the gas injection part; and
a support provided between at least one of the plurality of plasma generation parts and a top surface of the gas injection part to support the plasma generation part so as to be spaced apart from the top surface of the gas injection part,
wherein one and the other of the plurality of plasma generation parts are disposed at heights different from each other from a bottom surface of the gas injection part.

2. The substrate processing apparatus of claim 1, further comprising an insulating plate provided between the plasma generation part and the gas injection part.

3. The substrate processing apparatus of claim 1, wherein the support is provided with a supply passage communicating between the plasma generation part and the gas injection part therein.

4. The substrate processing apparatus of claim 3, wherein the insulating plate is disposed to be in contact with the gas injection part, and the support is installed above the insulating plate.

5. The substrate processing apparatus of claim 1, further comprising a cooling plate provided between the plasma generation part and the gas injection part and provided with a circulation passage through which a heat medium is circulated.

6. The substrate processing apparatus of claim 1, further comprising a docking adapter provided between the plasma generation part and the support to connect the plasma generation part to the support.

7. The substrate processing apparatus of claim 1, wherein the gas injection part has an installation groove, which is installed by embedding a portion of the plasma generation part into at least a portion of the top surface on which the plurality of plasma generation parts are disposed.

8. The substrate processing apparatus of claim 1, wherein the plasma generation part comprises:
at least one first plasma generation part disposed at a central side of the gas injection part on a plane to generate plasma and supply the process gas to the gas injection part; and
at least one second plasma generation part disposed at an edge side of the gas injection part on the plane to generate plasma and supply the process gas to the gas injection part.

9. The substrate processing apparatus of claim 8, wherein the first plasma generation part is disposed at a higher position from the bottom surface of the gas injection part than the second plasma generation part.

10. The substrate processing apparatus of claim 8, wherein the second plasma generation part is provided in plurality, and the plurality of second plasma generation parts are disposed to be point-symmetrical to each other on the plane with respect to the first plasma generation part.

11. The substrate processing apparatus of claim 10, wherein the plurality of second plasma generation parts are disposed at the same height as each other, which is a low position from the bottom surface of the gas injection part rather than the first plasma generation part.

12. The substrate processing apparatus of claim 1, wherein the gas injection part comprises a backing plate which is installed in the opening and in which a plurality of gas introduction parts are provided, at positions corresponding to the plurality of plasma generation parts.

13. The substrate processing apparatus of claim 12, wherein RF power is applied to the backing plate.

14. The substrate processing apparatus of claim 12, wherein the gas injection part comprises a plurality of diffusion plates provided at positions overlapping the plurality of gas introduction parts on a plane below the backing plate.

15. The substrate processing apparatus of claim 14, wherein the gas injection part comprises an injection plate which is installed below the backing plate to define a diffusion space, in which the diffusion plate is installed between the backing plate and the injection plate, and in which a plurality of injection holes for injecting the process gas are defined.

16. The substrate processing apparatus of claim 12, wherein the gas injection part comprises an injection plate installed below the backing plate to define a plurality of injection holes through which the process gas is injected into the processing space.

17. The substrate processing apparatus comprising:

a process chamber having an opening in an upper portion thereof;

a gas injection part coupled to the opening to define a processing space for substrate processing together with the process chamber and inject a process gas into the processing space;

a plurality of plasma generation parts disposed above the gas injection part to generate plasma and configured to radicalize the process gas so as to supply the radicalized process gas into the gas injection part;

wherein one and the other of the plurality of plasma generation parts are disposed at heights different from each other from a bottom surface of the gas injection part;

wherein the gas injection part comprises a backing plate which is installed in the opening and in which a plurality of gas introduction parts are provided, at positions corresponding to the plurality of plasma generation parts;

wherein the gas injection part comprises a plurality of diffusion plates provided at positions overlapping the plurality of gas introduction parts on a plane below the backing plate; and wherein the gas injection part comprises a support shaft having one end coupled to pass through the backing plate so as to be accessible from a top surface of the backing plate and the other end coupled to the diffusion plate to support the diffusion plate.

18. The substrate processing apparatus of claim 1, further comprising a power apply part disposed on a top surface of the gas injection part to apply RF power to the plasma generation part.

19. The substrate processing apparatus of claim 18, wherein the power apply part independently applies the RF power to each of the plurality of plasma generation part.

*   *   *   *   *